United States Patent
Baldwin et al.

(10) Patent No.: US 6,402,904 B1
(45) Date of Patent: Jun. 11, 2002

(54) SYSTEM AND METHOD FOR PERFORMING SPUTTER DEPOSITION USING INDEPENDENT ION AND ELECTRON SOURCES AND A TARGET BIASED WITH AN A-SYMMETRIC BI-POLAR DC PULSE SIGNAL

(75) Inventors: David Alan Baldwin, Annadale; Todd Lanier Hylton, Great Falls, both of VA (US)

(73) Assignee: 4 Wave, Inc., Alexandria, VA (US)

( * ) Notice: Subject to any disclaimer, the term of this patent is extended or adjusted under 35 U.S.C. 154(b) by 0 days.

(21) Appl. No.: 09/810,687

(22) Filed: Mar. 16, 2001

(51) Int. Cl.[7] .............................................. C23C 14/34
(52) U.S. Cl. ............................. 204/192.13; 204/192.11; 204/298.06; 204/298.08; 204/298.03; 204/298.04
(58) Field of Search ....................... 204/192.12, 192.13, 204/192.11, 298.06, 298.08, 298.03, 298.04

(56) References Cited

U.S. PATENT DOCUMENTS

| | | | |
|---|---|---|---|
| 3,583,361 A | 6/1971 | Laudel, Jr. .................. | 118/49.5 |
| 4,046,666 A | 9/1977 | McClanahan et al. ...... | 204/298 |
| 4,278,890 A | 7/1981 | Gruen et al. .............. | 250/492.8 |
| 4,639,301 A | 1/1987 | Doherty et al. ......... | 204/192.31 |
| 4,684,848 A | 8/1987 | Kaufman et al. ....... | 315/111.81 |
| 4,805,555 A | 2/1989 | Itoh .......................... | 118/719 |
| 5,064,520 A | * 11/1991 | Miyake et al. ......... | 204/182.11 |
| 5,114,556 A | 5/1992 | Lamont, Jr. ............. | 204/192.12 |
| 5,303,139 A | 4/1994 | Mark .......................... | 363/63 |
| 5,651,865 A | 7/1997 | Sellers ................... | 204/192.13 |
| 5,733,418 A | 3/1998 | Hershcovitch et al. . | 204/192.11 |
| 5,770,023 A | 6/1998 | Sellers ..................... | 204/192.3 |
| 2001/0004047 A1 | 6/2001 | Kahn et al. ............. | 204/192.11 |

OTHER PUBLICATIONS

Zhurin, et al., "Biased Target Deposition", Front Range Research, Fort Collins, Colorado 80524, received May 27, 1999; accepted Sep. 2, 1999, pp. 37–41.

* cited by examiner

Primary Examiner—Steven H. VerSteeg
(74) Attorney, Agent, or Firm—Morgan, Lewis & Bockius LLP

(57) ABSTRACT

A system and method for performing sputter deposition on a substrate include ion and electron sources that generate ion and electron currents directed at a target. Biasing circuitry biases the target with an a-symmetric bi-polar DC voltage pulse signal. The biasing circuitry is formed from positive and negative voltage sources and a high frequency switch. A current sensor, coupled to the biasing circuitry, monitors positive and negative currents from the target. A control system, coupled to the current sensor, varies the ion and electron currents independently. The ion and electron sources create a continuos plasma that is proximate the target. Ions attracted from the plasma sputter the target, and material from the target is deposited on the substrate. Electrons attracted from the plasma neutralize accumulated charge on the target.

4 Claims, 3 Drawing Sheets

SYSTEM AND METHOD FOR PERFORMING SPUTTER DEPOSITION USING INDEPENDENT ION AND ELECTRON SOURCES AND A TARGET BIASED WITH AN A-SYMMETRIC BI-POLAR DC PULSE SIGNAL

FIELD OF INVENTION

The present invention is directed generally to novel systems and methods for performing sputter deposition, and to optical devices manufactured using such systems and methods.

BACKGROUND OF THE INVENTION

Conventional pulsed target plasma sputtering systems generate their plasma via application of 10 to 500 kHz pulsed DC power to a sputter target. Most commonly, magnetic fields of several times 0.01 Telsa are disposed proximate to the target to intensify the plasma formed. During negative pulses, ions drawn from the plasma sputter the target, and material from the target is deposited on a substrate. It is believed that electrons from the plasma neutralize charge on the target during parts of the pulse cycle when the negative voltage is off. It is believed that in a conventional pulsed-target plasma sputtering apparatus, the target pulsing power supply must provide a high-voltage leading edge, for the purpose of ignition of the plasma, on every pulse. While it is believed that a system comprising the application of a-symmetric bi-polar DC pulse signals for such a purpose is known, such systems in the prior art require complicated circuitry and such systems fail to provide means for independently controlling the ion currents and the electron currents at the target. Moreover, since the plasma ignition is partly a stochastic event/process, there is a degree of process uncertainty and instability. It would be beneficial to provide a system that provides better control of the process without adding complex circuitry to the apparatus arrangement.

SUMMARY OF THE INVENTION

The present invention is directed to a system for performing sputter deposition on a substrate. Biasing circuitry biases the target with an a-symmetric bi-polar DC voltage pulse signal. The biasing circuitry is formed from a positive voltage source with respect to ground, a negative voltage source with respect to ground and a high frequency switch. At least one current sensor, coupled to the biasing circuitry, monitors a positive current and a negative current from the target during one or more cycles of the a-symmetric bi-polar DC voltage pulse signal. A control system, coupled to the at least one current sensor, varies the ion current independently from the electron current. The ion and electron sources create a continuous plasma that is proximate the target and the biasing circuitry causes the target to alternatively attract ions and electrons from the plasma. The ions attracted from the plasma sputter the target, and material from the target is deposited on the substrate. The electrons attracted from the plasma neutralize accumulated charge on the target. In one embodiment, the controller varies the a-symmetric bi-polar DC voltage pulse signal used to bias the target independently from the ion and electron currents. In this embodiment, target voltages and currents are tailored to optimize film deposition parameters.

The invention also includes an optical filter that is created by a disclosed method and process. The optical filter comprises a substrate, and material disposed on the substrate by the disclosed process and method.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1:
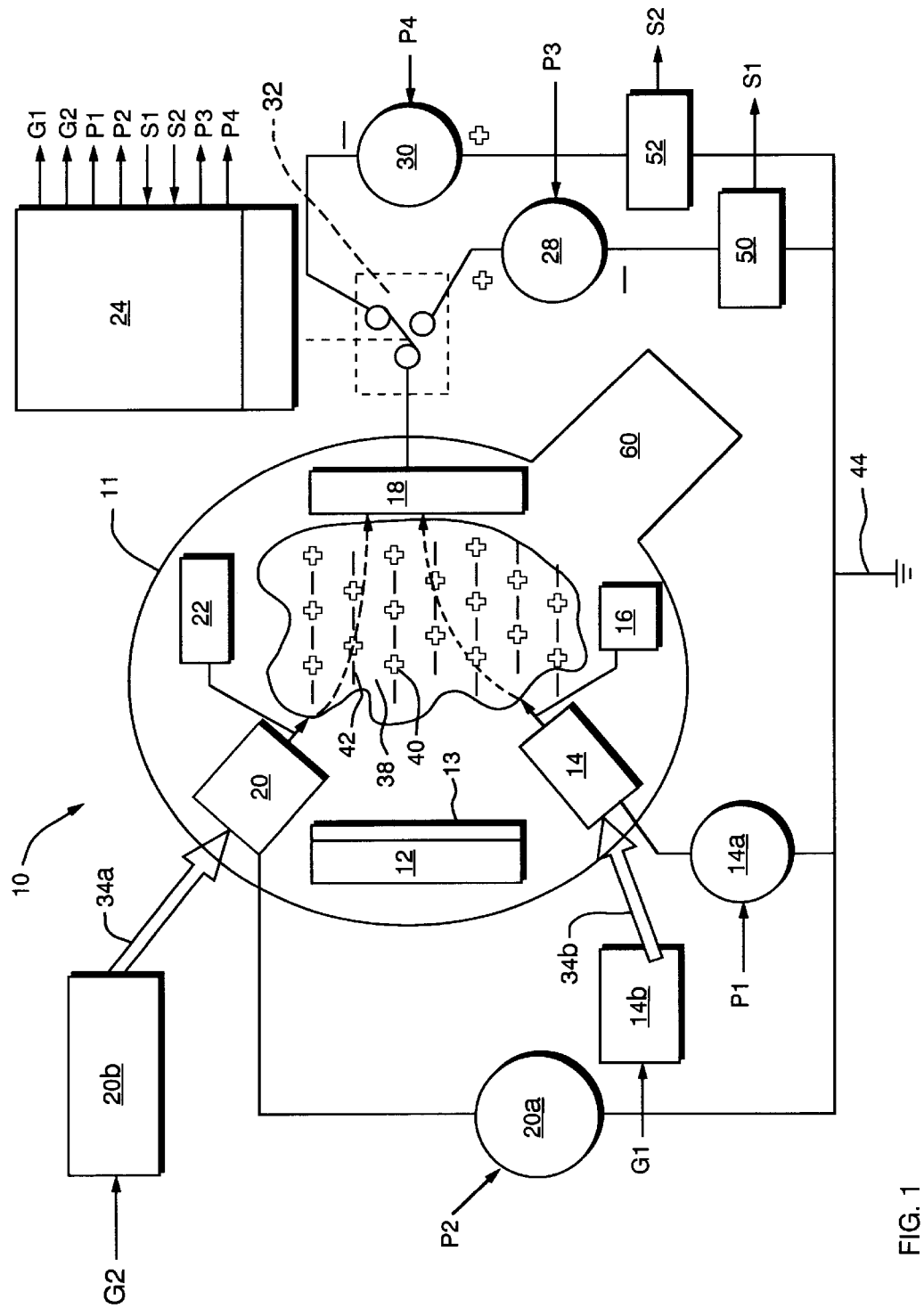
FIG. 1 is a schematic diagram of the system for performing sputter deposition using independent ion and electron sources and a target biased with an A-Symmetric BI-Polar DC pulse signal according to the present invention.

There is shown in FIG. 1, a system 10 for performing sputter deposition on a substrate 12. System 10 comprises an ion source 14 that generates an ion current 16. The ion current 16 is directed primarily at a target 18. System 10 further comprises an electron source 20 that generates an electron current 22. The electron current 22 is directed at the target 18. The ion source 14, the electron source 20 and the target 18 are disposed in a chamber 11. A vacuum pump 60 reduces the pressure within the chamber 11. The pressure within the chamber 11 during operation is about $10^{-3}$ to $10^{-5}$ torr.

Exemplary ion sources 14 useful for implementing the present invention include end-Hall or closed drift Hall Ion sources such as the Mark II™ source of Commonwealth Scientific Corp. In one embodiment, ion source 14 is a divergent ion current source that generates a divergent ion beam characterized by an ion current distribution that varies in accordance with the equation: ion current=$J_o \cos(\theta)$; where θ is an angle between the central axis of the divergent ion beam and a direction of the ion current, and $J_o$ is the ion current density along the central axis. Exemplary electron sources 20 useful for implementing the present invention include hollow cathode electron sources such Commonwealth Scientific Corp.'s HCES5000 or a plasma bridge electron source such as that offered by Commonwealth Scientific Corp. or Veeco Instruments.

A gas 34b (for example, Ar, Xe, $N_s$, or $O_2$) is supplied by a gas controller 14b (or mass flow controller) to ion source 14. The volume of gas output by gas controller 14b is varied by process controller 24. An ion source power supply 14a is coupled to the ion source 14, and supplies a control voltage to ion source 14. The output of ion source power supply 14a is varied by process controller 24. Control signals (from process controller 24) are supplied to both the ion source power supply 14a, and the ion source gas controller 14b, in order to vary the magnitude of ion current 16 at target 18. In one embodiment, ion current 16 will vary linearly with changes in the flow rate of gas 34b supplied to ion source 14. In addition, for a given flow rate of gas 34b supplied to ion source 14, the ion current 16 generated from the ion source and flowing toward target 18 will vary proportionately with the magnitude of the voltage control signal supplied by ion source power supply 14a to ion source 14.

A gas 34a (for example, Ar, Xe, $N_s$, or $O_s$) is supplied to electron source 20 by a gas controller (or mass flow controller) 20*b*. Gas 34*a* may be of a different type than gas 34*b*. The volume of gas output by gas controller 20*b* is varied by process controller 24. An electron source power supply 20*a* supplies a control voltage to electron source 20. The voltage supplied to electron source 20 by electron power supply 20*a* is varied by process controller 24. It will be understood by those skilled in the art that by varying the quantity of gas 34*a* supplied to electron source 20 and the voltage supplied by electron source power supply 20*a* to electron source 20, the electron current emanating from electron source 20 toward the sputtering target 18 may be controlled. In one embodiment, so long as a minimum quantity of gas 34*a* is supplied to electron source 20, the magnitude of the electron current 22 will vary linearly based on the magnitude of the signal supplied by the electron source power supply 20*a* to the electron source 20.

System 10 further includes a pair of current sensors 50, 52. Each of the current sensors has an output that is coupled to process controller 24. Each current sensor preferably includes a low pass filter with a time constant that is relatively long when compared with the frequency of switch 32 (e.g., about 100 kHz.) Each current sensor 50, 52, supplies a signal S1, S2 respectively to process controller 24 that is proportional to the output of its corresponding voltage source 28, 30, averaged over time. Although in the embodiment shown, current sensors 50, 52 are shown as being disposed between voltage sources 28, 30, respectively, and ground, the current sensors 50, 52 could be positioned at any location in the circuitry useful for measuring the positive and negative currents at or near target 18.

Process controller 24 regulates the positive and negative currents at target 18 by varying independently the ion and electron currents 16, 22 with control signals P1, P2 to power supplier 14*a*, 20*a*, and control signals G1, G2 to gas controllers 14*b*, 20*b*. Such control is independent of the settings applied to voltage sources 28, 30, which may be chosen/varied to optimize other properties such as deposition film qualities. In one embodiment, process controller 24 varies the ion current and electron current 16, 22, respectively, in order to deliver an equal amount of positive and negative charge to target 18 during each cycle of the a-symmetric bi-polar DC voltage pulse signal discussed below. Target neutralization is required, for example, to efficiently sputter material from the target when the target is insulating. In an alternative embodiment, process controller 24 varies the ion and electron currents 16, 22, respectively, so that about 10% more negative charge than positive charge is applied to target 18 during each cycle of the a-symmetric bi-polar DC voltage pulse signal. The purpose of this alternate embodiment is to assure neutralization of target 18. It will be understood by those skilled in the art that the relative percentages of positive and negative charge supplied to target 18 by the ion and electron currents 16, 22, respectively, during any given cycle of the a-symmetric bi-polar DC voltage pulse signal, are a matter of design choice, and that variations from the embodiments described herein are within the scope of the present invention.

Process controller 24 also includes a switch driver logic circuit that switches at about 100 KHz, but those skilled in the art will recognize that alternate types of pulse control systems may be used, including systems that operate at other frequencies. A switch signal (e.g. about 100 KHz) is supplied from process controller 24 to switch 32. Switch 32, together with biasing circuitry formed from a positive voltage source 28, and a negative voltage source 30, generate an a-symmetric bi-polar DC voltage pulse signal for biasing target 18 (such as the a-symmetric bipolar DC voltage pulse signal shown in FIG. 2). The control signals P3 and P4 adjust the magnitude of the positive and negative voltages (in the a-symmetric bi-polar DC pulse signal) applied to the target 18 by the voltage sources 28, 30.

Figure 2:
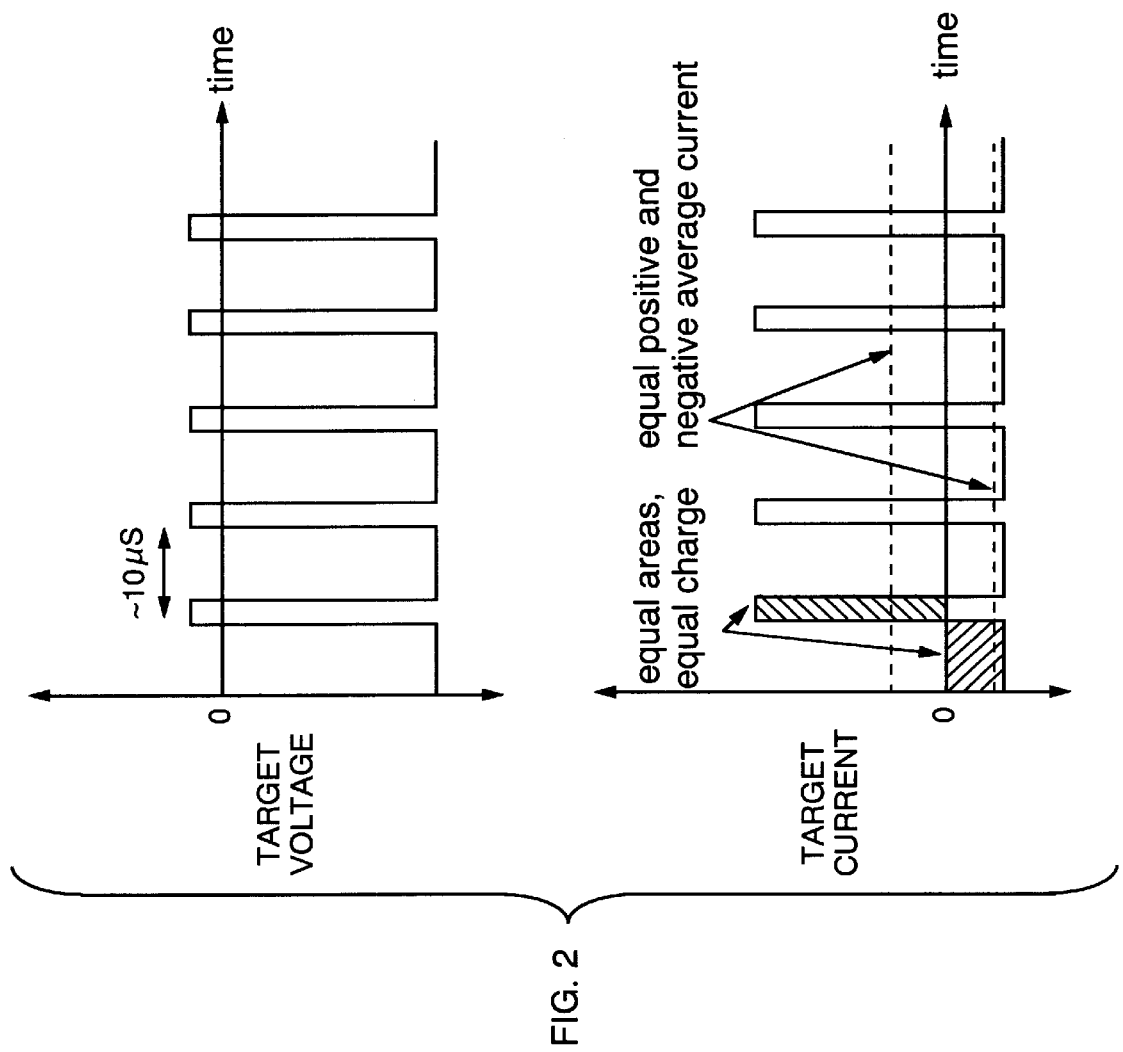
FIG. 2 shows an exemplary a-symmetric bi-polar DC pulse signal used for biasing a target, together with diagrams showing sensed electron and ion currents at the target during several cycles of the a-symmetric bi-polar DC pulse signal, according to the present invention.

Referring now to FIG. 2, there is shown a timing diagram showing several cycles of an exemplary a-symmetric bi-polar DC pulse signal, together with diagrams showing sensed positive and negative currents at the target during several cycles of the a-symmetric bi-polar DC pulse signal, at a position proximate target 18. In the embodiment shown in FIG. 2, the amount of negative charge supplied by electron current 22 to target 18 during the positive portion of each cycle of the a-symmetric bi-polar DC voltage pulse signal is roughly equal to the amount of positive charge supplied by ion current 16 to target 18 during the negative portion of each cycle of the a-symmetric bi-polar DC voltage pulse signal. This condition is generally necessary to neutralize the target on each cycle of the a-symmetric bi-polar DC voltage pulse signal.

During operation of system 10, gas 34*a*, 34*b* (such as Ar, Xe, $N_2$, and $O_2$) is fed through the ion source 14 and the electron source 20, and bias signals from power supplies 14*a*, 20*a* are applied to sources 14, 20, respectively, to create a continuous plasma 36 proximate the target 18. The a-symmetric bi-polar DC target biasing signal causes the target 18 to alternatively attract ions 40 and electrons 42 from the plasma 38. The ions 40 attracted from the plasma 38 sputter the target 18. The electrons 42 attracted from the plasma 38 neutralize accumulated charge on the target 18 which charge is generally accumulated on insulating targets. Voltage source 30 supplies a negative voltage with respect to ground 44, and voltage source 28 supplies a positive voltage with respect to ground 44. In one embodiment, voltage source 28 supplies a DC voltage of about 50 V, voltage source 30 supplies a DC voltage of about −1000 V, and switch 32 toggles between its two poles at about 100 kHz. It will be understood by those skilled in the art that the particular voltage levels supplied by sources 28, 30, and the particular frequency of switch 32 are matters of design choice, and the exemplary values given should not be considered as limitative of the scope of the present invention.

A method for performing sputter deposition on the substrate 12 using the system shown in FIG. 1, will now be described. Ion current 16 is generated and directed at the target 18 by the ion source 14. Electron current 22 is generated and directed at the target 18 by the electron source 20. The ion current 16, the electron current 22 and the a-symmetric bi-polar DC voltage pulse signal are independently controlled by the control system 24, by controlling voltage sources 28, 30, power supplies 14*a*, 20*a*, switch 32 and gas controllers 14*b* and 20*b*. The ion source 14 and electron source 20 create a continuous plasma 38 that is proximate the target 18. The biasing circuitry causes the target 18 to alternatively attract positive ions 40 and negative electrons 42 from the plasma 38. The ions 40 that are attracted from the plasma 38 sputter the target 18. The electrons 42 that are attracted from the plasma 38 neutralize positive charge that accumulates on the target 18 during the sputtering phase. The ensuing sputtering of the target 18 creates a flux of target atoms or molecules that uniformly distributes as deposition coating 13 on the substrate 12.

Use of the present invention allows for independent adjustment of ion and electron currents 16, 22 using relatively simple circuitry. In addition, by varying the voltages supplied by power supplies 28, 30 (using, for example, process controller 24) the upper and lower voltages in the a-symmetric bi-polar DC voltage pulse signal can be independently varied, thereby varying the voltages used to attract ions during the negative portion of the pulse cycle and electrons during the positive portion of the pulse cycle. In addition, it will be understood by those skilled in the art that, by varying the switching signal supply to switch 32, the relative duration of the positive and negative portions of each cycle of the a-symmetric bi-polar DC voltage pulse signal can also be varied. Independent control of each of these parameters affords independent control of plasma properties, sputtering properties and target charge management during operation of system 10.

Figure 3A:
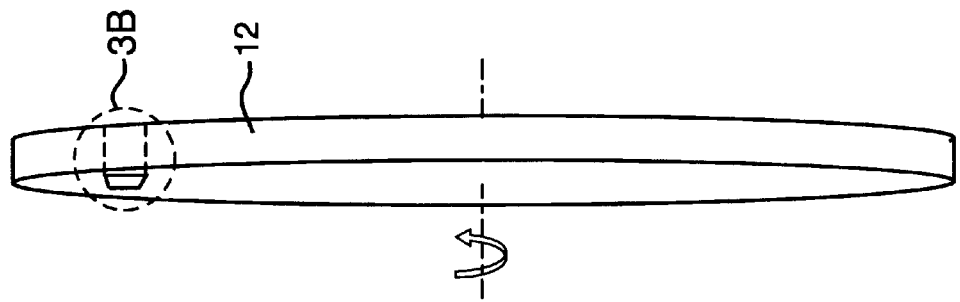
FIGS. 3A and 3B show an exemplary optical filter formed using the system and method of the present invention.
Figure 3B:
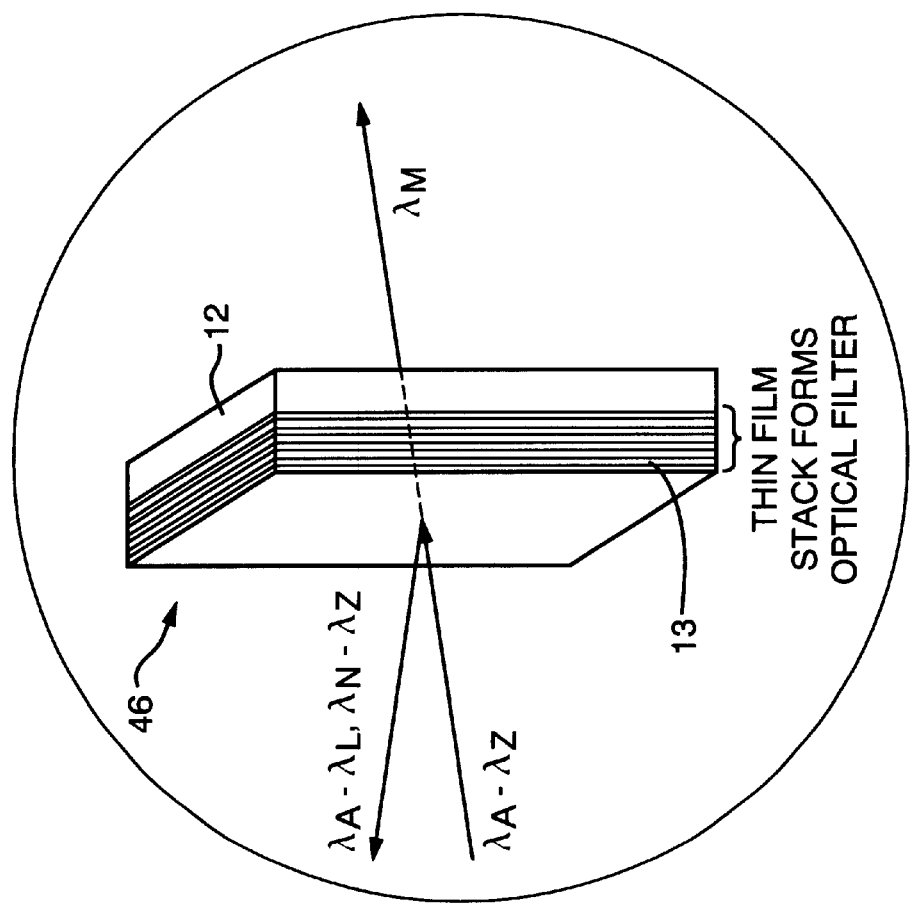

A product described by the process above may be advantageously used to create an optical filter 46. As shown in FIGS. 3A, 3B, filter 46 receives wavelengths $\lambda_A - \lambda_Z$, passes $\lambda_M$ and reflects $\lambda_{A\_}\lambda_L$, $\lambda_{N\_}\lambda_Z$. When the present invention is used to form an optical filter, material 13 (preferably a dielectric) is deposited on the substrate 12 by operating the ion source 14 and the electron source 20 using a control system 24, such as the one described above, that varies the ion current 16 independently from the electron current 22 and that biases the target 18 with the a-symmetric bi-polar DC voltage pulse signal. In the case of an optical filter, the substrate 12 is preferably formed of a glass wafer, the material deposited on the substrate is alternating layers of tantalum oxide and silicon oxide, and the thickness of the material deposited on the substrate is low-order multiples and/or fractions of the optical thickness at the wavelength of light that the filter will serve to isolate. The filter 46 may be used in the form deposited or it may be further processed by sawing, grinding, trimming, back-thinning, polishing, mounting, bonding or other means to incorporate the filter into an optic assembly. It will be evident to practitioners of the art that substrates other than glass may be used, that smaller substrate pieces may be attached to the wafer 12 for deposition of filters on the smaller pieces, that deposited materials other than tantalum oxide and silicon oxide could be used for the filter, as long as the refractive index contrast was sufficiently large, and that a variety of differing optical stack designs might be employed to create a filter.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for performing sputter deposition, comprising:
   (a) an ion source that generates an ion current directed at a target;
   (b) an electron source that generates an electron current directed at the target;
   (c) biasing circuitry that biases the target with an a-symmetric bi-polar DC voltage pulse signal, the circuitry being formed from a positive voltage source with respect to ground, a negative voltage source with respect to ground and a high frequency switch;
   (d) at least one current sensor, coupled to the biasing circuitry, that monitors a positive current and a negative current from the target during one or more cycles of the a-symmetric bi-polar DC voltage pulse signal;
   (e) a controller, coupled to the at least one current sensor, that varies the ion current independently from the electron current;
   (f) wherein the ion and electron sources create a continuous plasma proximate the target, and the biasing circuitry causes the target to alternatively attract ions and electrons from the plasma;
   (g) wherein the ions attracted from the plasma sputter the target and material from the target is deposited on a substrate; and
   (h) wherein the electrons attracted from the plasma neutralize accumulated charge on the target.

2. The system of claim 1, wherein the ion source, the electron source and the target are disposed in a chamber having a pressure between $10^{-3}$ to $10^{-5}$ torr during operation of the system.

3. The system of claim 1, wherein the controller varies the a-symmetric bi-polar DC voltage pulse signal used to bias the target independently from the ion and electron currents.

4. A method for performing sputter deposition, the method comprising the steps of:
   (a) generating an ion current directed at a target by an ion source;
   (b) generating an electron current directed at the target by an electron source;
   (c) biasing the target with biasing circuitry that generates an a-symmetric bi-polar DC voltage pulse signal, the circuitry being formed from a low voltage source, a high voltage source and a high frequency switch;
   (d) monitoring, with at least one current sensor coupled to the biasing circuitry, a positive current and a negative current from the target during one or more cycles of the a-symmetric bi-polar DC voltage pulse signal;
   (e) varying, with a controller coupled to the at least one current sensor, the ion current independently from the electron current;
   (f) wherein the ion and electron sources create a continuous plasma proximate the target, and the biasing circuitry causes the target to alternatively attract ions and electrons from the plasma;
   (g) wherein the ions attracted from the plasma sputter the target and material from the target is deposited on a substrate; and
   (h) wherein the electrons attracted from the plasma neutralize accumulated charge on the target.

* * * * *